(12) United States Patent
Van Rooyen et al.

(10) Patent No.: US 11,426,877 B2
(45) Date of Patent: Aug. 30, 2022

(54) ROBOTIC DRUMMER

(71) Applicant: UVic Industry Partnerships Inc., Victoria (CA)

(72) Inventors: Robert Van Rooyen, Victoria (CA); George Tzanetakis, Victoria (CA)

(73) Assignee: UVic Industry Partnerships Inc., Victoria (CA)

( * ) Notice: Subject to any disclaimer, the term of this patent is extended or adjusted under 35 U.S.C. 154(b) by 0 days.

(21) Appl. No.: 15/980,640

(22) Filed: May 15, 2018

(65) Prior Publication Data

US 2018/0326588 A1 Nov. 15, 2018

Related U.S. Application Data

(60) Provisional application No. 62/506,539, filed on May 15, 2017.

(51) Int. Cl.
| | | |
|---|---|---|
| *H01S 3/30* | (2006.01) | |
| *B25J 11/00* | (2006.01) | |
| *G10H 1/32* | (2006.01) | |
| *B25J 9/16* | (2006.01) | |
| *G10H 1/00* | (2006.01) | |
| *G10H 1/40* | (2006.01) | |
| *H02P 7/025* | (2016.01) | |
| *H01S 5/02216* | (2021.01) | |

(52) U.S. Cl.
CPC ......... *B25J 11/004* (2013.01); *B25J 9/1653* (2013.01); *B25J 9/1674* (2013.01); *G10H 1/0008* (2013.01); *G10H 1/0066* (2013.01); *G10H 1/32* (2013.01); *G10H 1/40* (2013.01); *H02P 7/025* (2016.02); *H01S 5/02216* (2013.01); *Y10S 901/09* (2013.01)

(58) Field of Classification Search
CPC ...... B25J 11/004; B25J 9/1653; B25J 9/1674; G10H 1/0008; G10H 1/32
USPC ......................................................... 318/14
See application file for complete search history.

(56) References Cited

U.S. PATENT DOCUMENTS 3,181,052 A * 4/1965 Carlson .................... H04Q 9/00
318/460
6,111,384 A * 8/2000 Stagnitto ................. G01P 3/481
318/602

(Continued)

OTHER PUBLICATIONS

Tzanetakis, "Robotic Percussionist for Musicians with Disabilities," Wighton Fund Proposal, Version 2.2, 38 pages (Nov. 11, 2016).

(Continued)

*Primary Examiner* — Muhammad S Islam
*Assistant Examiner* — Zemenay T Truneh
(74) *Attorney, Agent, or Firm* — Klarquist Sparkman, LLP

(57) ABSTRACT

Robotic drummers include voice coil actuators that are coupled to linear-to-rotary motion convertors to produce drumstick rotations so as to strike a drum head. Such rotations can be triggered via a microprocessor using stored performance data, by a user with a mouse, trackpad, joystick, or other user input device. Performances are enhanced by driving the VCA with drive signals have random variations associated with strike timing, amplitude, location, and speed. Multiple strikes are provided by reducing, eliminating, or reversing drumstick rotation with a corresponding drive signal upon detection of drumstick contact with the drum head.

13 Claims, 15 Drawing Sheets

(56) References Cited

U.S. PATENT DOCUMENTS

| | | | | |
|---|---|---|---|---|
| 2007/0030865 A1* | 2/2007 | Day | ................... | H01S 5/02216 |
| | | | | 372/4 |
| 2008/0303445 A1* | 12/2008 | Neuman | .............. | H05B 47/165 |
| | | | | 315/76 |
| 2013/0303836 A1* | 11/2013 | Coble | ................... | A61F 5/0102 |
| | | | | 600/28 |
| 2016/0315573 A1* | 10/2016 | Kang | ................... | H02P 25/028 |

OTHER PUBLICATIONS

Van Rooyen et al., "Pragmatic Drum Motion Capture System," Proceedings of the International Conference on New Interfaces for Musical Expression, pp. 339-342 (May 31-Jun. 3, 2015).

Van Rooyen et al., "Pragmatic Drum Motion Capture System," Proceedings of the International Conference on New Interfaces for Musical Expression, 1 page (May 31-Jun. 3, 2015).

Van Rooyen et al., "Snare Drum Motion Capture Dataset," Proceedings of the International Conference on New Interfaces for Musical Expression, pp. 329-330 (May 31-Jun. 3, 2015).

Van Rooyen et al., "Snare Drum Performance Motion Analysis," Proceedings of the International Conference on New Interfaces for Musical Expression, 6 pages (Jul. 11-15, 2016).

Van Rooyen et al., "Voice Coil Actuators for Percussion Robotics," Proceedings of the International Conference on New Interfaces for Musical Expression, 6 pages (May 15-19, 2017).

* cited by examiner

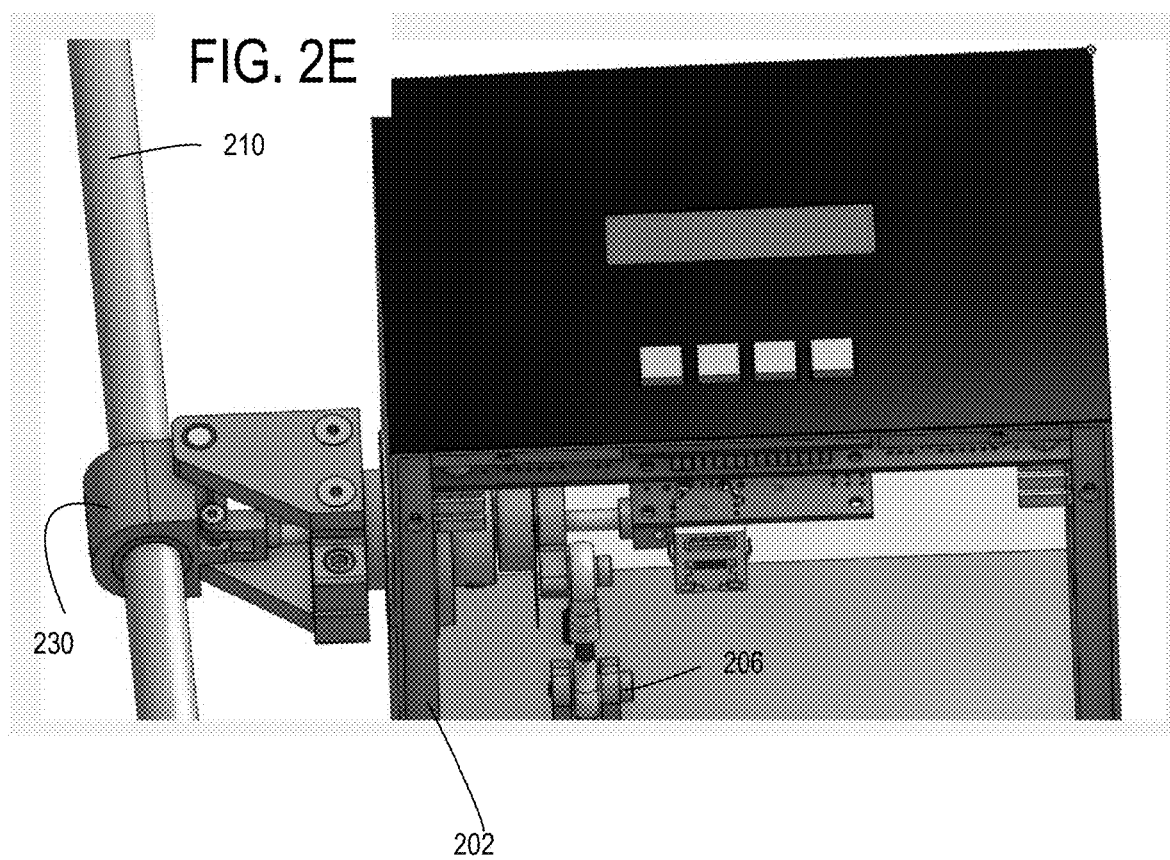

| Note | Onset (μ) | Onset (σ) | Velocity (μ) | Velocity (σ) | Position (μ) | Position (σ) | Hand |
|---|---|---|---|---|---|---|---|
| 1 | -0.018 | 0.004 | -1324.101 | 131.453 | 29.318 | 0.161 | L |
| 2 | 0.053 | 0.004 | -1029.712 | 112.868 | 29.799 | 0.053 | L |
| 3 | 0.118 | 0.004 | -515.806 | 66.100 | 42.962 | 0.341 | R |
| 4 | 0.197 | 0.004 | -227.061 | 80.203 | 43.666 | 0.323 | R |
| 5 | 0.252 | 0.004 | -761.860 | 26.731 | 30.598 | 0.510 | L |
| 6 | 0.321 | 0.004 | -620.436 | 111.393 | 30.669 | 0.150 | L |
| 7 | 0.379 | 0.005 | -424.778 | 136.845 | 44.004 | 0.250 | R |
| 8 | 0.457 | 0.005 | -226.775 | 77.906 | 44.024 | 0.099 | R |

ROBOTIC DRUMMER

CROSS REFERENCE TO RELATED APPLICATION

This application claims the benefit of U.S. Provisional Application No. 62/506,539, filed May 15, 2017, which is hereby incorporated by reference in its entirety.

FIELD

The disclosure pertains to mechanical drumming systems.

BACKGROUND

Mechanical systems for use with percussion instruments generally do not provide sounds that are satisfactory. Such systems also tend to be complex and expensive, and are not adapted for use by persons with disabilities. Improved robotic systems and methods are needed.

SUMMARY

Robotic drumming apparatus comprise a voice coil actuator (VCA) that includes a shaft and a linear-to-rotary motion convertor coupled to the VCA shaft. A rotary encoder is coupled to the linear-to-rotary motion convertor so as to indicate a rotation produced by the linear-to-rotary motion convertor. A rotatable shaft is coupled to the linear-to-rotary motion convertor so as to rotate in response to a linear motion of the shaft of the VCA. In typical examples, a striking implement retainer is secured to the rotatable shaft. In some embodiments, the linear-to-rotary motion convertor includes a crank arm secured to a rotatable wheel, wherein the crank arm is coupled to the VCA shaft so as to rotate the rotatable wheel in response to the linear motion of the VCA shaft. In other examples, an H-bridge is coupled to the VCA so as to apply control signals to the VCA. In one example, a microprocessor and a digital-to-analog convertor are configured to generate the control signals applied to the VCA. In still further examples, a PID controller on a chip is situated to generate the control signals applied to the VCA. In additional representative examples, the PID controller reduces VCA drive current in response to detection of contact of a striking implement with a surface. In still further examples, the controller is configured to increase the VCA drive current as the striking implement retainer is rotating away from the surface so as to produce a multistrike. In still further examples, the microprocessor provides a random offset to the VCA current and is associated with a random variation in amplitude, tempo, or strike position. In another example, a second VCA is situated to move a striking implement across a surface, wherein the rotatable shaft is coupled to the linear-to-rotary motion convertor so as to rotate a striking implement tip so as to contact the surface. In a specific example, a bell crank is coupled to the second VCA so that linear motion of a shaft of the second VCA moves the tip of the striking implement across the surface. shaft.

Methods comprise applying a control current to a VCA so as to manipulate a striking implement to contact a drum head and detecting contact of the striking implement with the drum head. The control current is reduced in response to the detecting of the contact. In some examples, a subsequent contact of the striking implement is initiated after the contact is detected after a bounce time elapses. According to some examples, the contact is detected based on an image of the drum head and the striking implement tip. In other examples, the contact is detected based on an electrical signal received from the VCA or based on a comparison of a predetermined home coordinate associated with the drum head and a current coordinate of the striking implement. In still additional examples, the VCA is coupled to produce a rotation, and the contact is detected based on a comparison of a predetermined home rotation associated with rotation of the striking implement so as to contact the drum head and a current rotation of the striking implement.

Methods of robotic drumming comprise applying a drive signal to a voice coil actuator and converting a linear motion of a shaft of the VCA to a rotary motion. A drumstick is coupled so as to be rotated in response to the rotary motion, wherein the drumstick is rotated so as to strike a surface corresponding to a drum head. In other examples, the drive signal is associated with a series of contacts with the drum head surface, and is based on drumstick displacements and speeds stored in a tangible computer readable medium. According to other examples, the series of contacts includes average values and deviations for one or more of drumstick tip speed, drumstick displacement above the drum head, and drumstick movement initiation time. In further examples, upon detecting contact of the striking implement with the drum head, the drive signal is reduced to produce a bounce. In some examples, the drumstick is set to strike the surface based on an acceleration associated with the VCA.

In other examples, methods comprise applying an EMF to a VCA and detecting contact with an object based on detection of a back EMF produced in response to the EMF applied to the VCA. In some embodiments, the EMF is applied to the VCA as a pulse width modulated (PWM) EMF, at least one of a pulse width, a pulse amplitude, or a duty cycle of the PWM EMF is adjusted in response to detection of contact with the object. In other examples, the object is contacted at a plurality of locations in response to the EMF applied to the VCA. A back EMF associated with the plurality of locations is detected, and based on detection of the back EMF, a surface shape of at least a portion of the object is determined. In typical examples, the surface shape includes at least one of a surface extent and a surface tilt and in further examples, a timing of the EMF applied to the VCA is adjusted.

Apparatus comprise a voice coil actuator (VCA) and a PID controller coupled to activate the VCA. A user interface is configured to display PID control values and permit user adjustment of one or more of the PID control values. In representative examples, a pulse width modulator (PWM) is situated to be responsive to the PID controller so as to activate the VCA. In still other examples, an H-bridge is situated to couple the PWM to the VCA. In a representative embodiment, the H-bridge is thermally coupled to a thermally conductive enclosure and a temperature controller is situated to adjust a temperature associated with the H-bridge or the enclosure. In other representative implementations, a fan is coupled to produce circulation in the enclosure, wherein the fan is coupled to the temperature controller so that the circulation is variable based on the temperature associated with the H-bridge or the enclosure. In some cases, the H-bridge includes a plurality of transistors that are thermally coupled to the thermally conductive enclosure.

The foregoing and other objects, features, and advantages of the disclosed technology will become more apparent from the following detailed description, which proceeds with reference to the accompanying figures.

BRIEF DESCRIPTION OF THE DRAWINGS

FIGS. 2A-2F illustrates a representative robotic drummer with a single drumstick installed.

DETAILED DESCRIPTION

Figure 1:
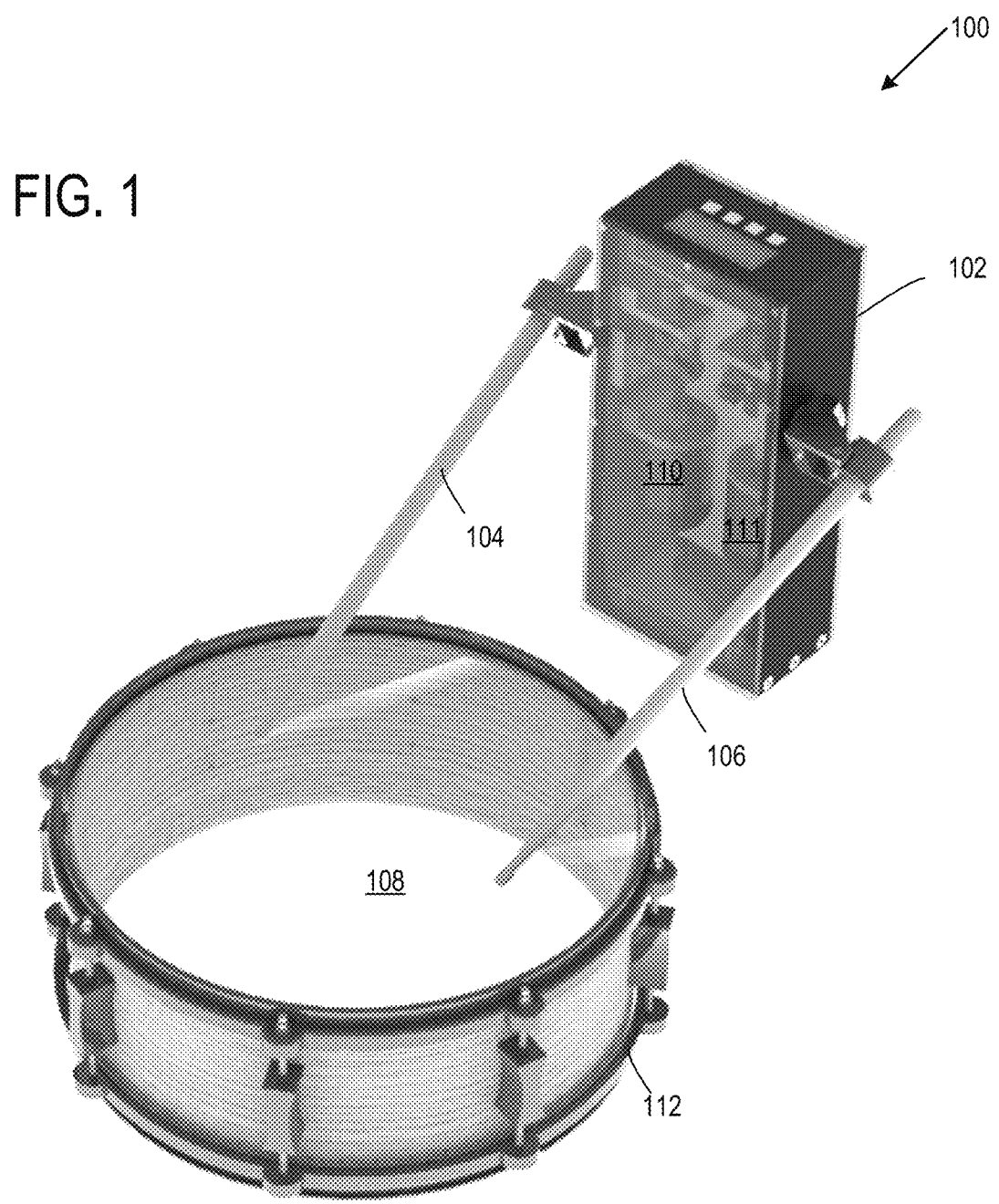
FIG. 1 illustrates a representative robotic drummer that uses two drumsticks.

Mechanical drummers are disclosed that incorporate electromechanical systems such as voice coil actuators (VCAs) that are suitably controlled to approximate human drumming. Human motion can be captured and modeled in a compressed statistical vector representation for rendering by a mechanical drummer when triggered by, for example, a MIDI interface or other network interface. The disclosed approaches can permit musicians and composers to conduct live and preprogrammed performances with a wide degree of control, and can enable performances by musicians with varying degrees of disabilities. Parameter driven stochastic model[s] can be provided to render unique human inspired performances.

VCA's can provide linear and continuous performance characteristics that meet or exceed human motion given appropriate sensors, driver electronics, closed loop control, and mechanical systems, and can be adapted to human motions associated with drumming. PID control of a VCA using various position sensors can permit positioning a VCA accurately with minimal damping time when tuned. Application specific PID control couples position control with momentary direction and force curves that take full advantage of VCA acceleration. This innovative approach to motion control is key to delivering a performance that is comparable to a human performance. Random variation in strikes can provide a more realistic, human feel. Stochastic models for timing, dynamics, and position can provide deliver unique performances that adhere to generalized percussion patterns or individual performance traits. Representative drumming mechanical implementations are provided that are controlled to produce sound associated with both single and multiple strikes. Motion capture analysis can be conducted to determine appropriate ranges of motion. The ability to create multiple strikes that is consistent with a human performance is enabled by application specific closed loop control, but is not limited by mechanics in terms of load and/or friction.

VCAs are linear motors that produce forces proportional to an applied current. A total range of motion is generally referred to as a "stroke," and strokes of up to 6 inches can be produced with a relatively constant forces. Rapid movement produces a back EMF proportional to speed, current, and magnetic field strength. Measurement of the back EMF can be used for motion detection or to provide motion control. In a typical VCA, a coil bobbin and shaft are freely movable, and closed loop control is generally needed. In the examples below, position sensors such as optical disk linear quadrature encoders or other optical encoders or Hall Effect proximity sensors are used.

Quadrature optical encoders provide sets of signals that can be decoded to determine speed and direction, and if needed, an index signal can be provided to indicate a complete rotation. A PID controller can be used to control VCA motion, and a VCA can be driven using an H bridge circuit so as to control speed and direction. PID control uses estimated or measured values associated with present error values, an integral of previous error values, and a current rate of change of error.

Examples are generally described with reference to vertical (i.e., striking motions) and not to lateral motions, such as drumstick motion across a drum head. This is for convenient explanation, and in other applications, such motions can be provided as well or instead. In some applications, drums are struck using both hands, but in some examples, only a single drumstick is used, In general, performances associated with a left hand, a right, or both hands can be produced.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper," "lower," and the like. These terms are used for convenient description, but do not imply any particular spatial orientation.

Time varying electric signals and voltages used to activate VCAs or other actuators are referred to generally as signals. In some cases, VCAs are driven with current signals, but suitable voltages can also be used Referring to FIG. 1, a representative apparatus 100 includes a frame 102 that retains a first striking implement 104 and a second striking implement 106 so as to be rotatable to strike a drum head 108. Striking implements are typically drumsticks or brushes, but other striking implements can be used. VCAs 110, 111 are mechanically coupled to the first striking implement 104 and the second striking implement 106, respectively, so that actuation of the VCAs 110, 111 can be used to strike the drum head 108. The frame 102 is generally fixed with respect to a drum 112 using an external stand, or can be fixed to the drum 112.

Figure 2A:
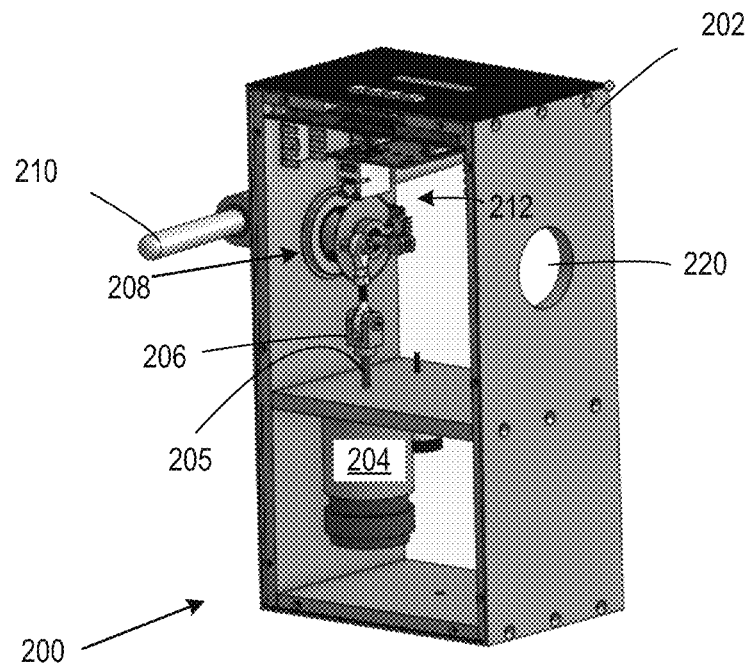
Figure 2B:
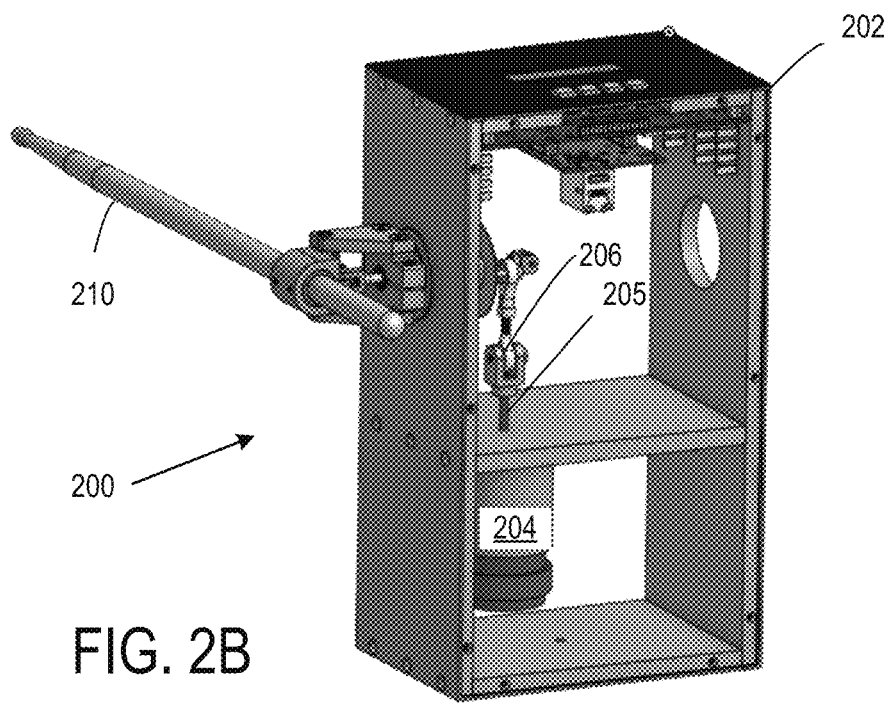

A representative drumming apparatus 200 is illustrated in detail in FIGS. 2A-2E. Referring to FIGS. 2A-2B, a VCA 204 is secured to a frame 202 so that linear motion of a VCA shaft 205 is coupled via a clevis 206 to a linear-to-rotary motion convertor 208. Rotary motion resulting from linear motion of the VCA shaft 205 produces a rotation of a striking implement 210 that can be used to strike a drum head. An encoder 212 is situated to measure a rotation associated with the linear-to-rotary motion convertor 208 so that striking implement rotation is measured. The frame 202 also includes an aperture 220 for use by a second VCA and associated motion convertors for a second striking implement.

Figure 2C:
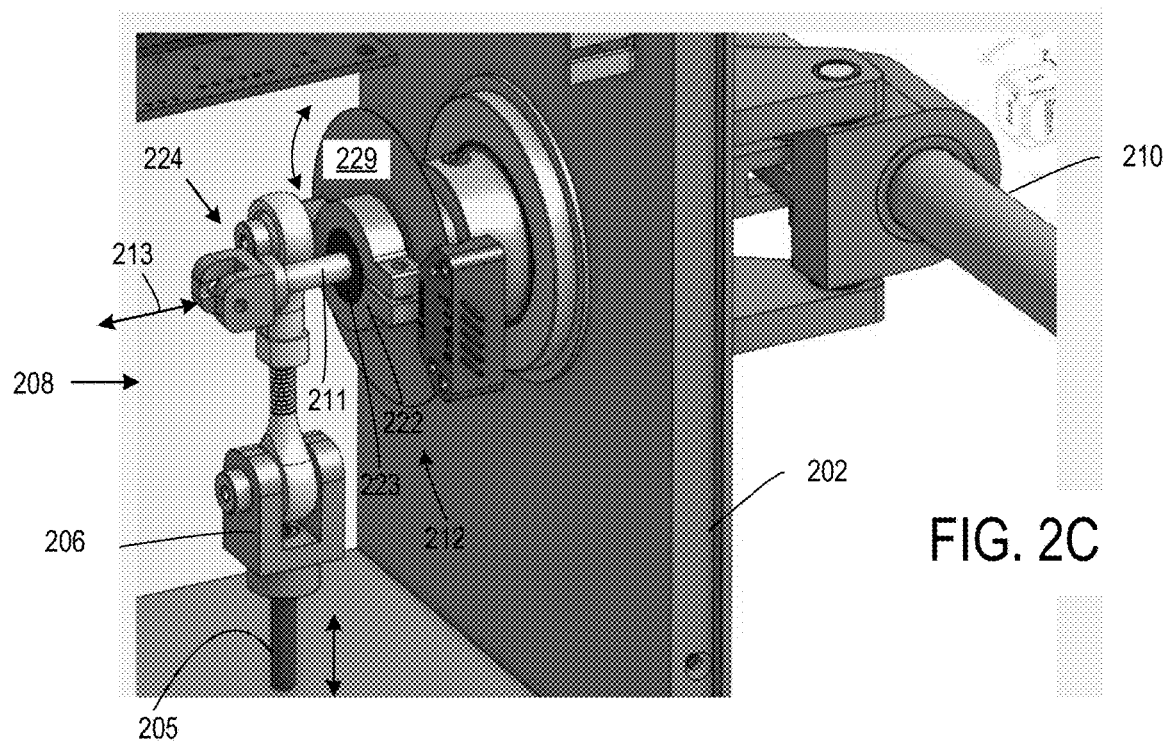
Figure 2D:
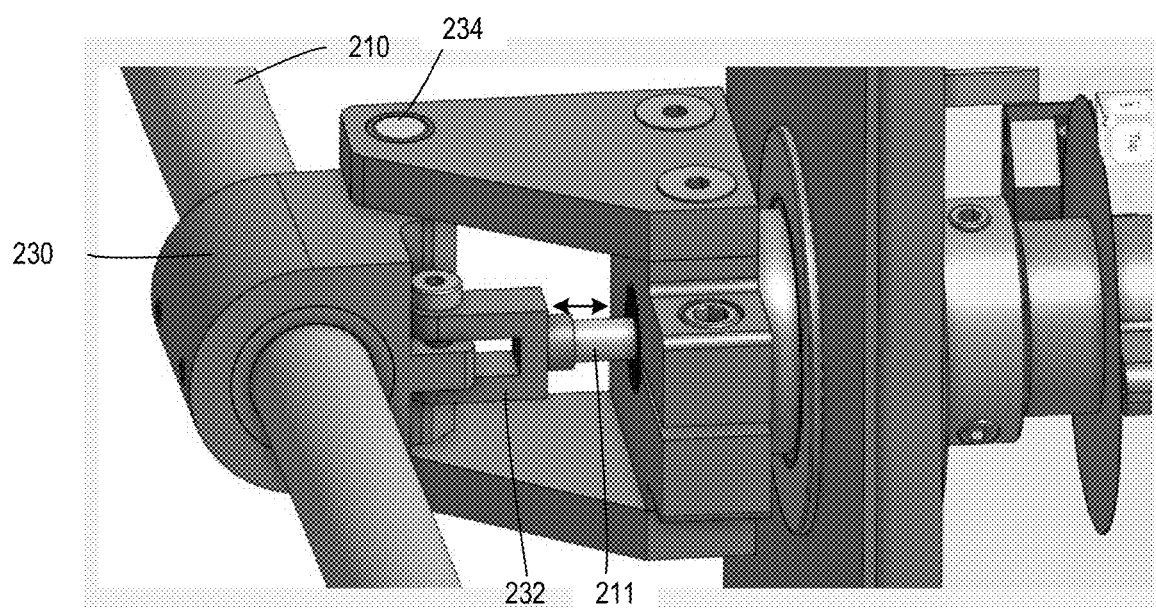
Figure 2F:
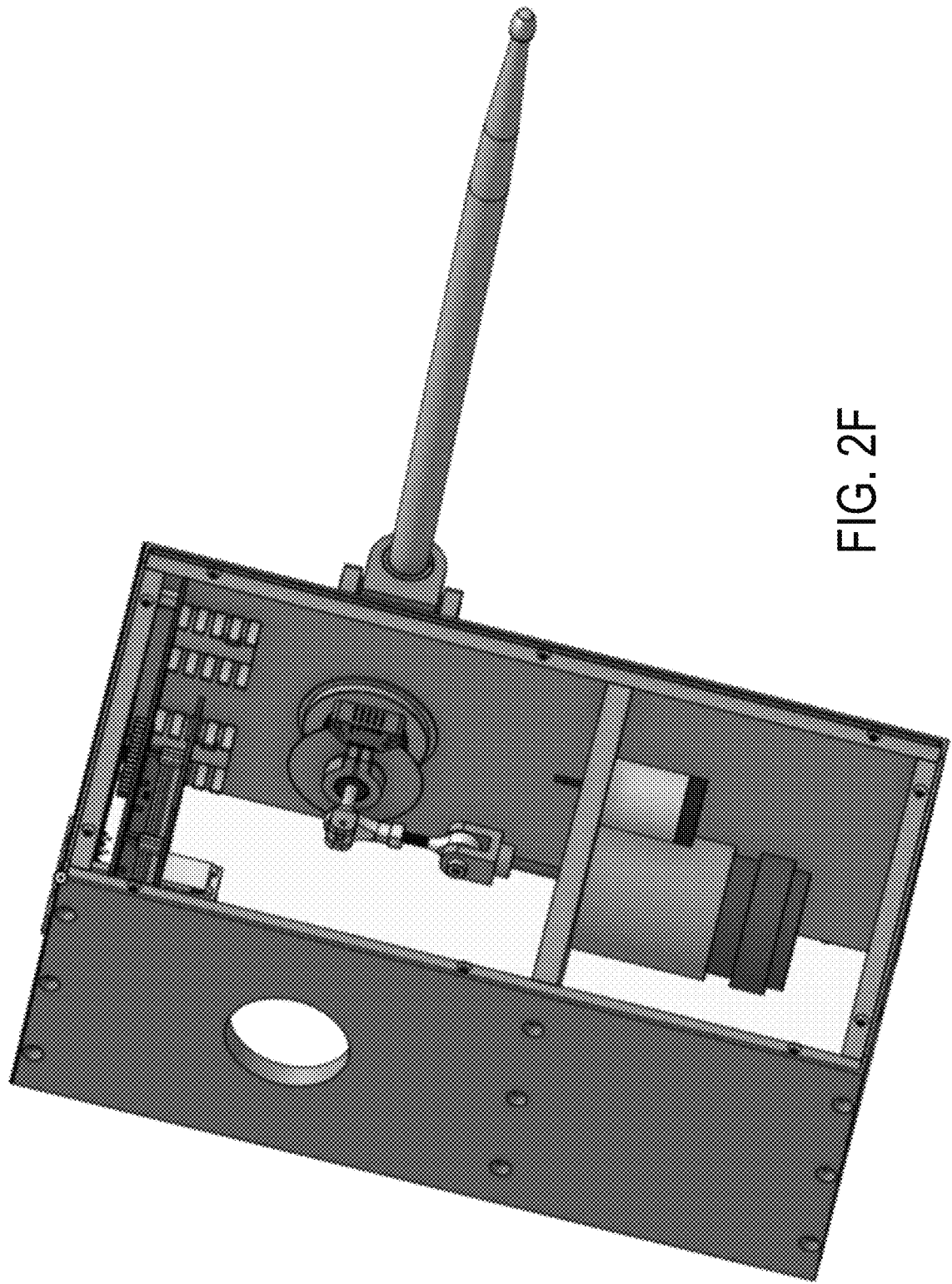

Referring to FIGS. 2C-2E, the linear-to-rotary motion convertor 208 includes a rotary member 222 secured to a rotatable hollow shaft 223 through which a shaft 211 extends. A linkage 224 coupled to the VCA shaft 205 by the clevis so that linear motion of the VCA shaft 205 rotates the rotary member 222 and a shaft. The rotary member 222 shown corresponds to a disk or wheel but with portions not used for attachment of the linkage 224 removed. An encoder disk 229 is secured for rotation measurement. In this example, the striking implement 210 is secured to the shaft 211 with a collar 230 that is coupled with a rotatable linkage 232 that provides rotation about a shaft 234 so that a tip of the striking implement 210 is movable across a striking surface in response to linear motion of the shaft 211 as shown at 213. Such linear motion can be provided with an additional VCA as discussed below, but is not shown in FIGS. 2C-2E.

Figure 3:
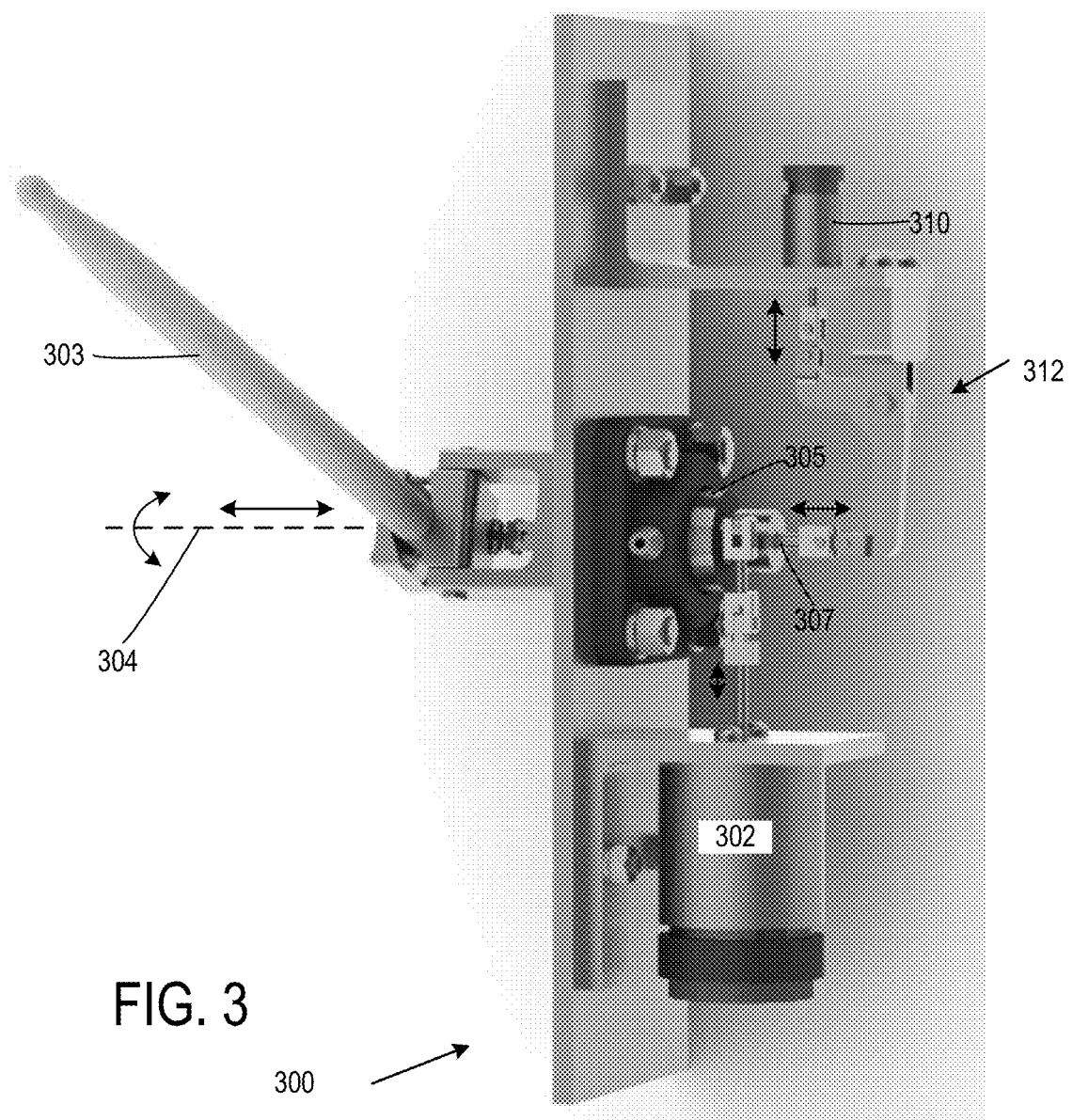
FIG. 3 illustrates a representative robotic drummer that includes voice coil actuator for use in striking a drum surface with a striking implement and a voice coil actuator for moving the drumstick to different locations on the drum head surface.

Referring to FIG. 3, a representative two axis drum assembly 300 includes a first VCA 302 coupled to rotate striking implement 303 about an axis 304 based on rotation of a shaft 305. A second VCA 310 is coupled to a bell crank 312 so that a shaft 307 is translatable along the axis 304 in response to activation of the VCA 310. Encoders can be provided to determine rotation and translation of the shaft 305, but are not shown for clarity in FIG. 3.

Figure 4:
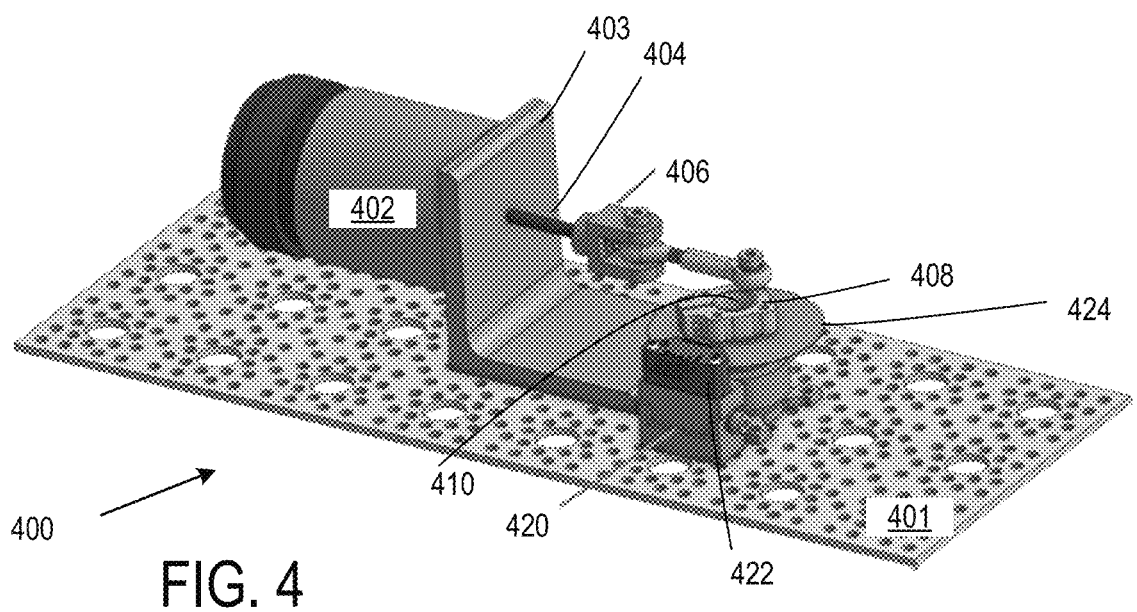
FIG. 4 illustrates a portion of another representative robotic drummer.

A representative mechanical arrangement 400 is illustrated in FIG. 4, and includes a VCA 402 having a shaft 404 that is coupled via a flexible coupling such as a clevis 406 to a crank 408 to convert linear motion of the shaft 404 to rotary motion of a shaft that is inserted into an aperture 410 so as to be coupled to the crank 408. The VCA 402 is secured to a base 401 with a bracket 403. An encoder assembly 420 includes an encoder readout 422 and an encoder wheel 424 that are coupled so as to indicate rotation of the crank 408.

Figure 5:
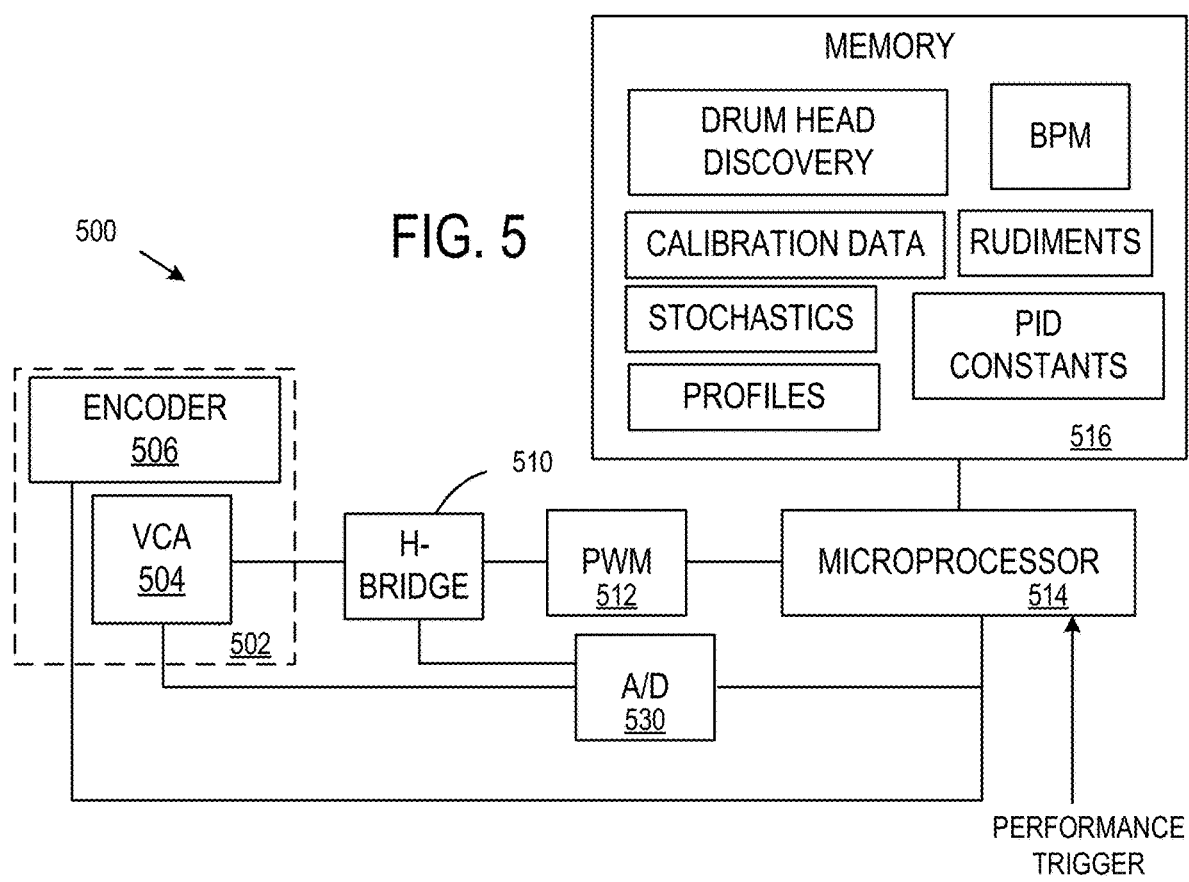
FIG. 5 illustrates a representative drive system coupled to a robotic drummer. Only a single VCA is shown in FIG. 5, but additional VCAs can be provided for additional drumsticks or to provide different types of motion such as striking motion and motion across a drum head.

With reference to FIG. 5, a representative drum system 500 includes a mechanical drum assembly 502 having a VCA 504 and an encoder 506. The VCA 504 is driven with an H-bridge 510 that is coupled to a pulse width modulator (PWM) 512 that receives drive signals produced by a microprocessor 514 based on computer executable instructions stored in a memory 516. The PWM 512 can be a separate component or provided by the microprocessor 514. The memory 516 typically stores calibration data, procedures and data for random or stochastic variation of drum strikes, and profiles associated with drumming patterns obtained from one or more human drummers. In some examples, the memory stores MIDI or other instructions for percussion rudiments such as roll, diddle, flam, and drag rudiments. In other alternatives, storage is remote, and procedures and data are provided via a network connection. Control of the VCA 504 is provided using PID control based on PID constants stored in the memory 516. A calibration procedure may be needed to obtain suitable PID constants. Some or all functions provided by the microprocessor 514 can be provided with dedicated analog or digital circuitry, and in many cases, such functions can be provided with a single integrated circuit, such as a custom ASIC. The H-bridge 510 is provided as it permits bi-directional control of VCA shaft extension so that the shaft can be driven in two directions (or allowed to move without a drive current applied). An analog-to-digital convertor (ADC) 530 is coupled to the VCA 504 to receive and digitize back EMFs to facilitate VCA control. Alternatively, an optical system can be used that determines striking implement position with respect to a drum head or other surface to be struck. The A/D converter 530 can also be connected to the H-Bridge 510 in order to monitor current.

The memory 516 can also include processor-executable instructions for determining position and orientation of a drum head, i.e., for drum head discovery with our without user intervention. One or more values of beats per minute (BPMs) can be received from a user and/or stored in the memory 516 for establishing timing for rudiments based on the stored rudiment data.

While mechanical drumming can be controlled via a MIDI or other network interface as shown in FIG. 5, "live" control can be provide using a wide variety of inputs and input devices such as motion tracking systems (using, for example, magnetic, radio, video, audio signals), buttons, sliders, air pressure, blink detection, audio, input generated in response to other musical instruments or cues.

Figure 6:
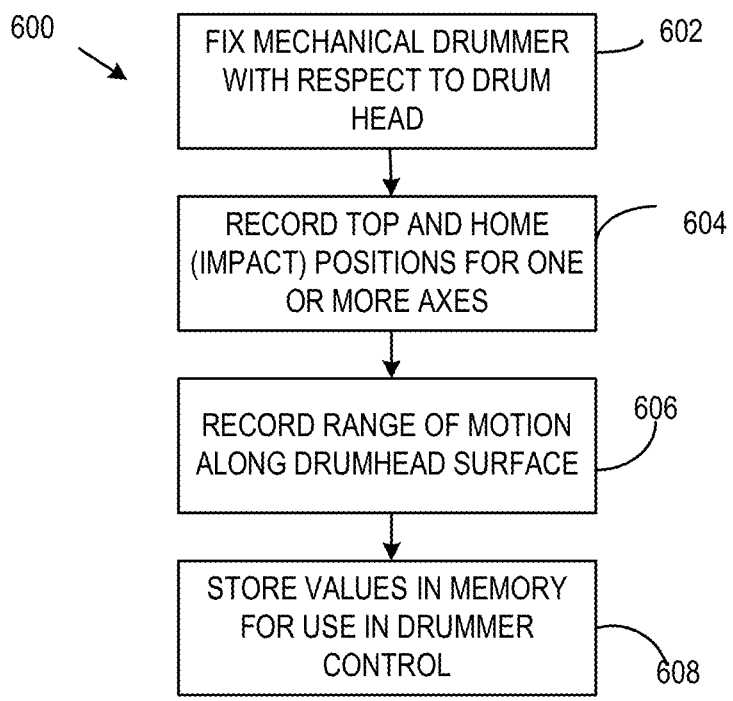
FIG. 6 illustrates a calibration method.

Referring to FIG. 6, a method 600 includes fixing a mechanical drum assembly with respect to a drum head at 602. At 604, a top position (i.e., greatest distance from a drum head) and a home position (i.e., an impact position) are determined for each striking implement based on optical or other measurements with respect to suitable axes. For example, positions can be determined with an optical system that includes a camera. At 606, associated ranges of motion across the drum head surface are measured. At 608, the measured values are stored in a memory or otherwise stored for use in controlling striking implements. In some cases, ranges of striking implement accelerations and speeds are measured along with striking implement movement resolution. Acceleration can be measured or establish to provide an approximate strength of strike that can be scaled to PWM duty cycle for VCA drive. In other examples, ranges and resolution can be obtained based on characteristics of an actuator and/or striking implement dimensions without additional measurements. Establishment of home and top position permits improved control of timing, dynamics, and timbre. Typically striking implement tip movement resolutions can be 0.10 inch, 0.05 inch, 0.025 inch, or other larger or smaller resolutions. Small enough resolution also permits relatively smooth motion of the striking implement.

While basic striking implement motion can be provided using the data obtained by the method of FIG. 5, calibration typically also uses adaptive learning to establish the extent and angle of the drum head surface and drum head performance characteristics. Rebound performance measurements can be used to populate a dynamic table, and calibration can be based on measurements of A-weighted sound pressure (SPL), but other weightings such as C-weightings can be used if appropriate. Loudness as a function of striking implement distance from the drum head prior to activation is determined and stored, with a maximum loudness typically associated with the top position.

Figures 7A, 7B:
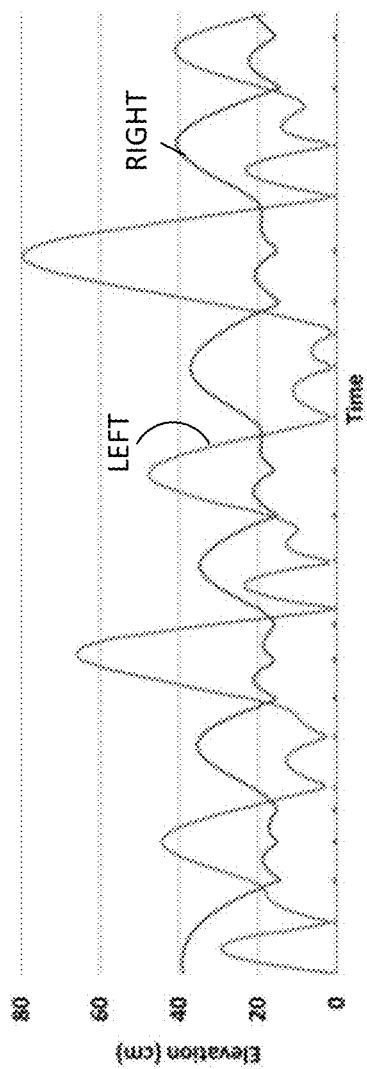
FIG. 7A illustrates recorded data for left and right drumstick tips.
FIG. 7B illustrates a portion of a vector data associated with a double roll.
Figure 8:
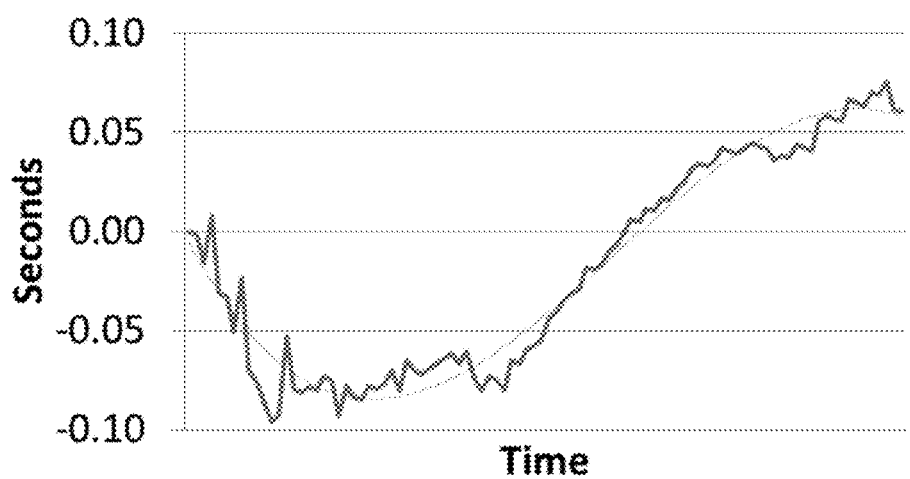
FIG. 8 illustrates tempo variation.

In some examples, motion profiles are obtained by recording striking implement positions from human performances. These profiles can then be used to determine VCA drive signals. Vector data can be used to represent strike events whose timing, velocity, and location are derived statistically from many repeated measures of a human performance. As an example, with a Double Stroke Open Roll rudiment shown in FIG. 7A, there are 32 striking events per measure. A first vector entry in the table of FIG. 7B equates to a first note in a single measure rudiment whose timing, velocity, and location and associated statistical parameters (standard deviations) are computed by evaluating the first strike of ten or more repeated measures. FIG. 7B contains only a subset of a full vector data table. Mean values are noted as $\mu$ and standard deviations as $\sigma$. Entries for second through the thirty-second notes contain parameters for rendering the specific note. With the statistical parameters for a complete measure, a unique performance can be rendered at will on a capable robotic or synthesis system. This concept can be extended to a large set of articulations that occupy sub-measures, measures, or entire scores. Each of the articulations should be thought of as a patch that can be loaded and triggered in the same manner as a sound or sample on a synthesis system. As shown in FIG. 8, tempo can drift during a performance, and such drift can vary among performers. To provide more natural sound, triggers for strike events can be allowed to drift as well.

Figure 9:
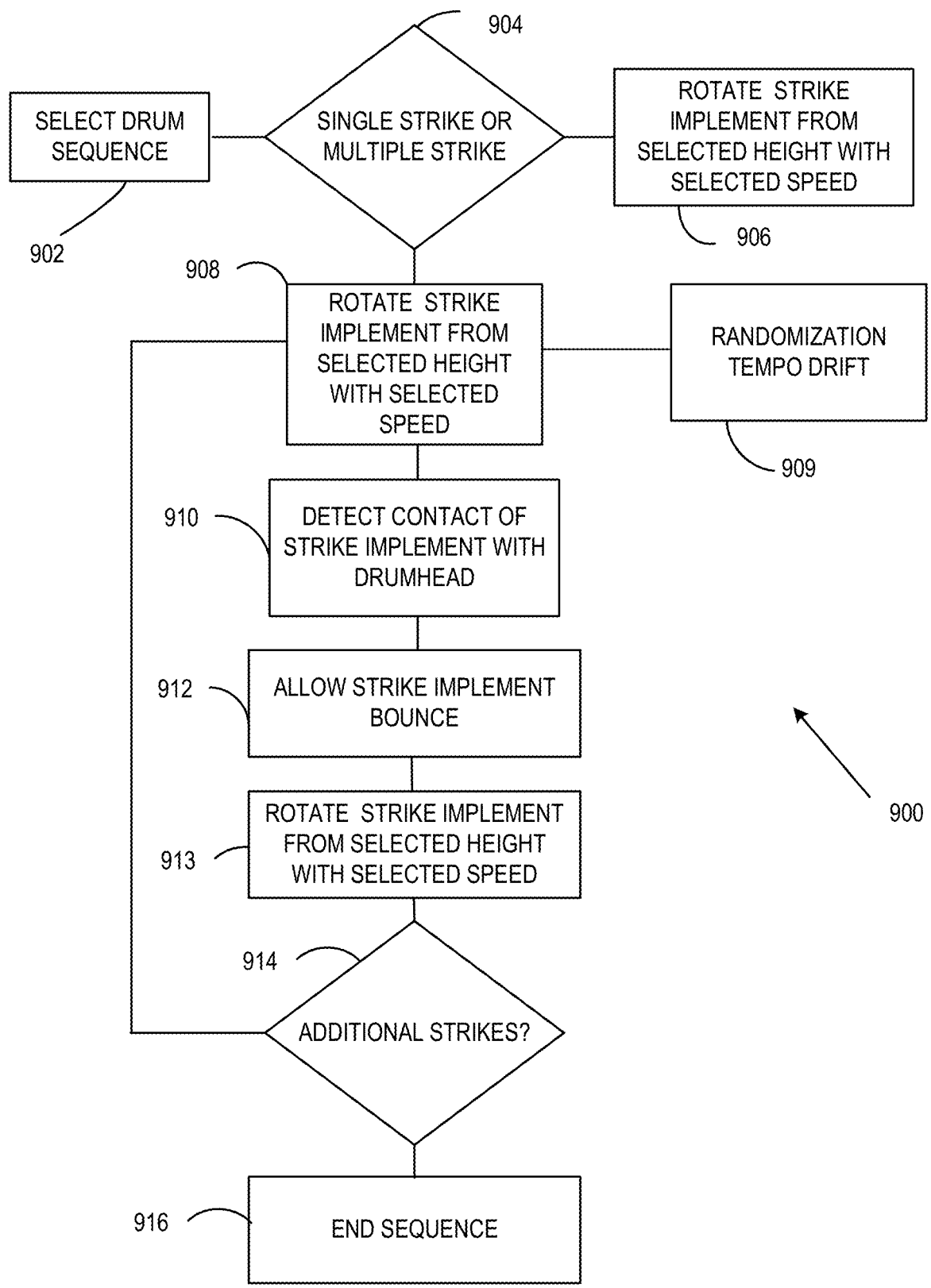
FIG. 9 illustrates a method of applying multiple or single strikes to a drum head.

Referring to FIG. 9, a representative method 900 includes selecting a sequence at 902, and determining if the sequence is a single or multiple strike sequence at 904. For a single strike, the strike implement is rotated with a selected time, height, and speed, at 906, and selected values can correspond to predetermined performances with or without inclusion of random variation. For multiple strikes, the strike implement is similarly rotated at 908. Contact of the strike implement with a drum head is detected at 910, and in response, actuator drive force is reduced to permit the strike implement to bounce at 912. After the bounce and at a suitable time, the strike implement is rotated for the next bounce at 913. At 914, it is determined if additional strikes are requested. If so, the method returns to 908, otherwise the sequence ends at 916. Random variations can be supplied at 909.

Figure 10:
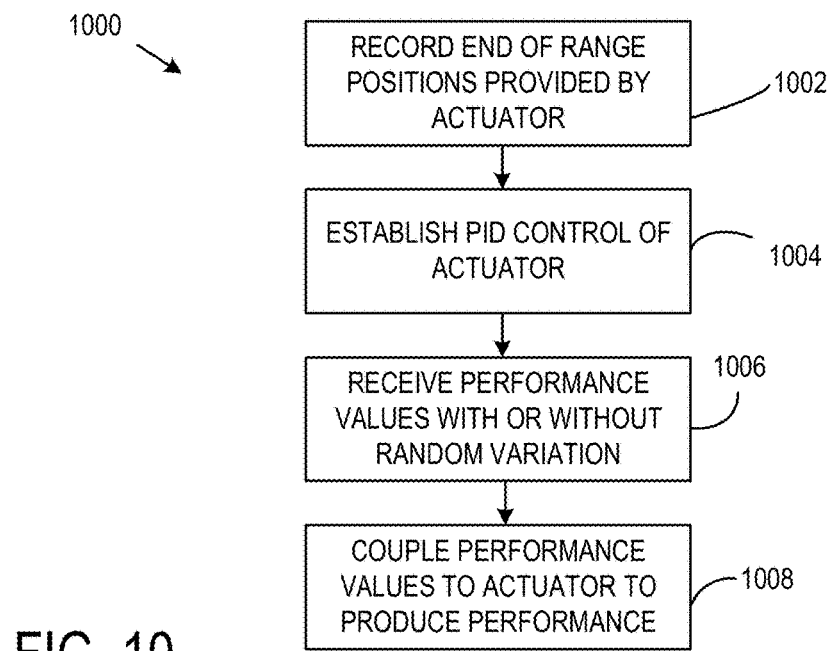
FIG. 10 illustrates a method of controlling an actuator such as a VCA.

With reference to FIG. 10, a control method for musical instrument control 1000 for a drum or other instrument includes recording actuator range limits at 1002, and establishing PID actuator control at 1004, typically by determining coefficients associated with proportional, integral, and derivative signals. At 1006, performance values are received with or without introduction of random variation to tempo, pitch, amplitude, drum head striking position or other performance related variables. At 1008, the performance values are applied to the actuator to produce the requested sounds.

Figure 11:
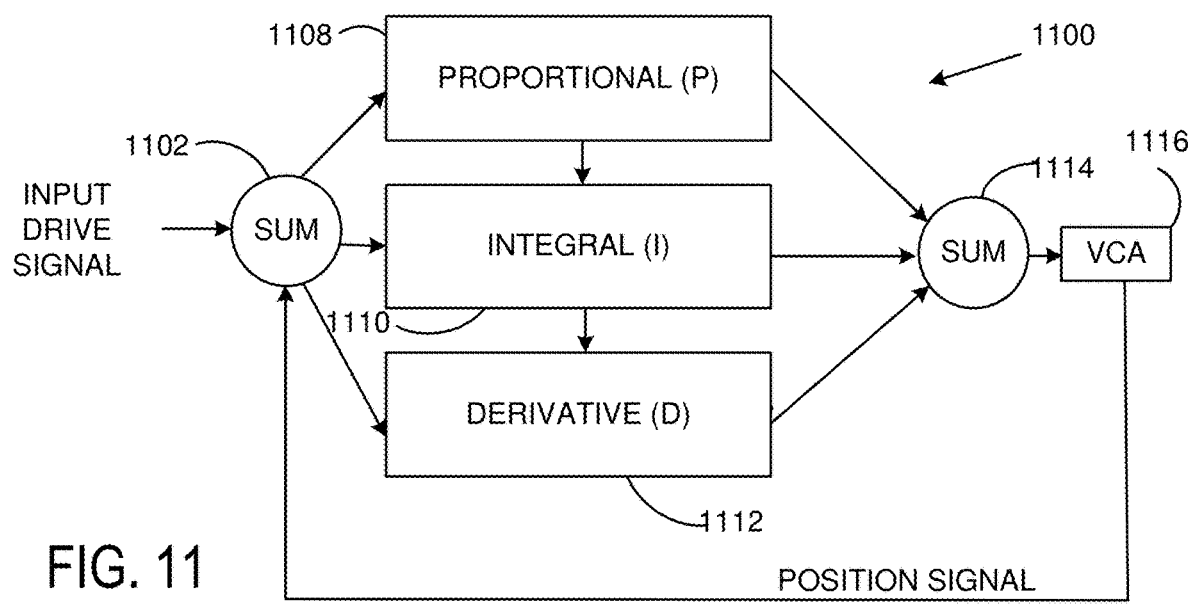
FIG. 11 illustrates PID control.

A PID control system 1100 is illustrated in FIG. 11, and can be implemented in hardware, software, or a combination thereof. A summing junction 1102 is coupled to receive a VCA drive input and couple the VCA drive input to proportional, integral, and derivative control components 1108, 1110, 1112 that are in turn coupled to a summing junction 1114. The sum is then coupled to drive a VCA 1116 or other actuator, and a position signal associated with an actuator position is returned to the summing junction 1102.

Figure 12:
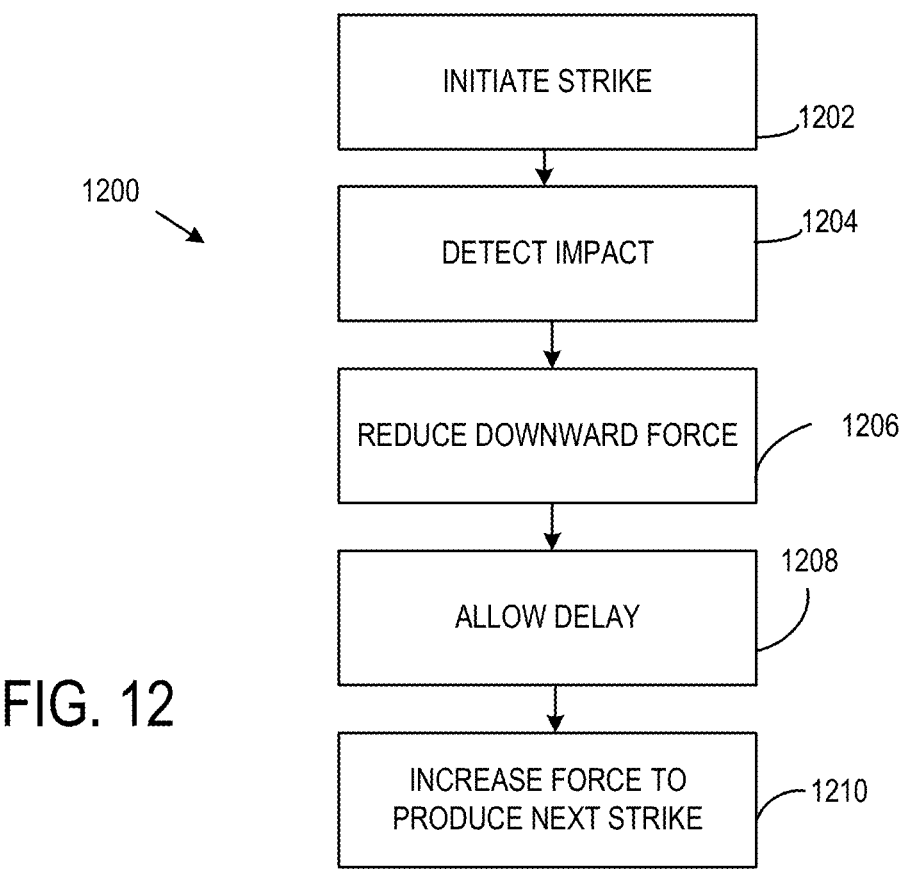
FIG. 12 illustrates a method of producing drumstick bounce.

A method 1200 for providing bounce is shown in FIG. 12. At 1202, a strike is initiated, and at 1204 contact with a drum head is detected. A camera or other optical system can be used, an actuator voltage or current change associated with contact can be detected, or a predetermined angle of rotation associated with contact can be detected. At 1206, downward force on the striking implement is reduced, eliminated or reversed, and at 1208, a delay period is allowed to elapse to provide time from the striking implement to move away from the drum head. At 1210, force is increased in order to produce a next strike. As noted above, two VCAs (X and Y axis) can be provided for each side (left and right) in a mechanical drummer. Each of these VCAs can be calibrated and controlled as discussed above. Additional VCAs or other actuators can be used to move striking implements across a striking surface.

While the haptic feedback used by human drummers is not available to time variable pressure on a striking implement to produce multiple strikes, such variable pressures can be applied as shown above in FIG. 12. Typically, VCA force is adjusted by adjustment of a duty cycle associated with pulse width modulation (PWM) after detecting a collision with the drum head. VCA force can also be adjusted by adjusting a VCA drive signal magnitude. Collision can be detected by mapping the plane during calibration and monitoring the encoder position at which the striking implement reaches the drum head surface. Alternatively, the current through the VCA can be sampled at a sufficient rate to detect a spike in current as the VCA encounters physical resistance at impact. Since the VCA is composed of a permanent magnet and a coil, a voltage will be induced when the shaft is moved, or in the case of a collision, restricted.

As noted above, a robotic drummer can be triggered via a computer interface such as a MIDI interface, or a pointing device can be used. Use of various input devices permits a robotic drummer to be adaptable to the needs of persons with disabilities.

Figure 13:
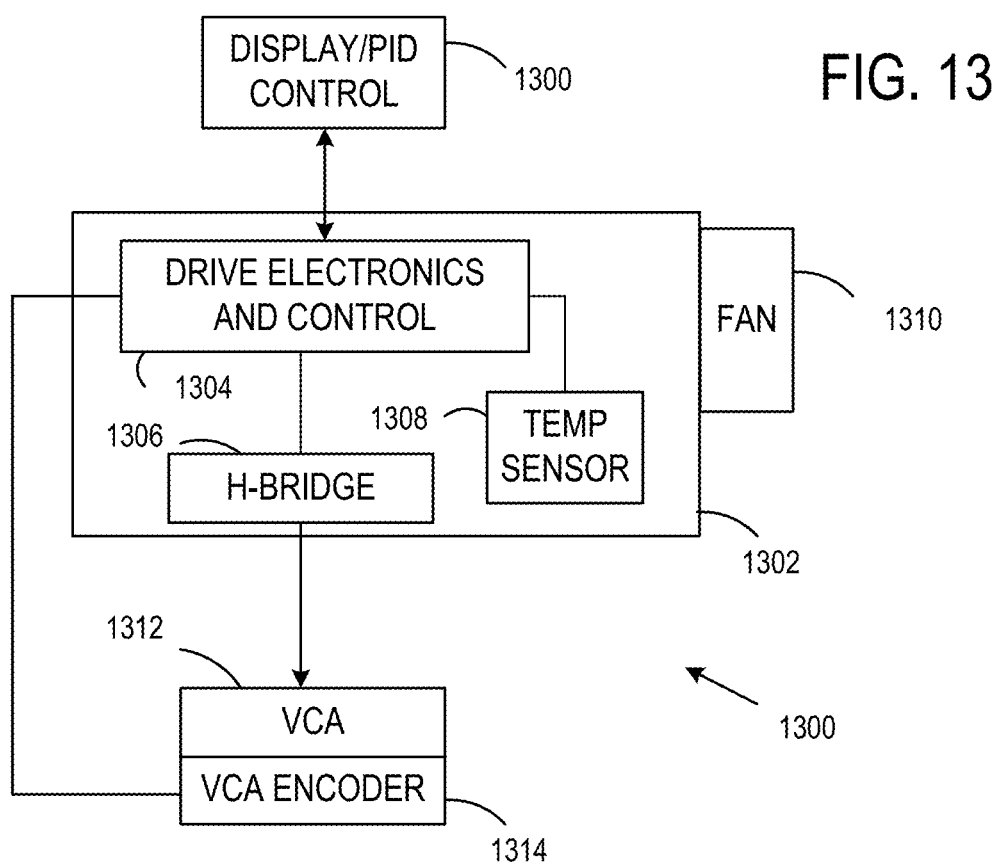
FIG. 13 illustrates a representative VCA control system.

Referring to FIG. 13, a VCA system 1300 includes drive electronic 1304, an H-bridge 1306, and a temperature sensor 1308 coupled to or contained by a conductive enclosure 1302. A fan 1310 is situated to direct a cooling flow to the enclosure 1302. The H-bridge 1306 is coupled to a VCA 1312 and VCA position can be determined based on an encoder 1314 that is coupled to drive electronics 1304. Typically, the VCA 1312 is controlled using PWM and PID, and an external control 1320 can be provided that includes a display or other output device and one or more computer input devices such as a keyboard, touchscreen, or pointing device so that PID and/or PID values can be viewed and adjusted.

It will be appreciated that the disclosed methods and apparatus can be used in applications other than drumming. For example, these approaches can be used generally to control VCAs and to assess VCA status (such as VCA velocity, acceleration, and/or position). In some applications, positions of surfaces other than drum heads can be assessed, and positions with respect to the determined surface locations can be established. Variations in surface position can be accommodated using surface discovery such as described above, and an angular tolerance of a surface can be established. Timing of contact with a surface such as a drum head or other surface can be established based on velocity with respect to the surface, and repetitive motion with respect to a surface can be characterized and/or controlled. Timing can be compensated for use with tilted or displaced surfaces, and surface positions and tilts can be discovered and compensated automatically.

In view of the many possible embodiments to which the principles of the disclosed technology may be applied, it should be recognized that the illustrated embodiments are only preferred examples and should not be taken as limiting the disclosure. We claim as our invention all that comes within the scope and spirit of the appended claims.

We claim:

1. An apparatus, comprising:
a voice coil actuator (VCA) that includes a shaft;
a linear-to-rotary motion convertor coupled to the shaft of the voice coil actuator;
a rotary encoder coupled to the linear-to-rotary motion convertor so as to indicate a rotation produced by the linear-to-rotary motion convertor;
a rotatable shaft coupled to the linear-to-rotary motion convertor so as to rotate in response to a linear motion of the shaft of the VCA;
a striking implement retainer secured to the rotatable shaft;
an H-bridge coupled to the VCA so as to apply control signals to the VCA;
a microprocessor and a PWM configured to generate the control signals to the H-Bridge to drive the VCA; and
an optical quadrature encoder and PID controller on a chip situated to generate the control signals applied to the VCA;
wherein the linear-to-rotary motion convertor includes a crank arm secured to a rotatable wheel, wherein the crank arm is coupled to the VCA shaft so as to rotate the rotatable wheel in response to the linear motion of the VCA shaft;
wherein the PID controller reduces the VCA drive current in response to detection of contact of a striking implement with a surface.

2. An apparatus, comprising:
a voice coil actuator (VCA) that includes a shaft;
a linear-to-rotary motion convertor coupled to the shaft of the voice coil actuator;
a rotary encoder coupled to the linear-to-rotary motion convertor so as to indicate a rotation produced by the linear-to-rotary motion convertor;
a rotatable shaft coupled to the linear-to-rotary motion convertor so as to rotate in response to a linear motion of the shaft of the VCA;
a second VCA situated to move a striking implement across a surface, wherein the rotatable shaft is coupled to the linear-to-rotary motion convertor so as to rotate a striking implement tip so as to contact the surface; and
a bell crank coupled to the second VCA so that linear motion of a shaft of the second VCA is coupled as a corresponding linear motion to the rotatable shaft.

3. The apparatus of claim 1, wherein the controller is further configured to increase the VCA drive current as the striking implement retainer is rotating away from the surface so as to produce a multistrike.

4. The apparatus of claim 1, wherein the PID controller terminates the VCA drive current in response to the detection of the contact.

5. The apparatus of claim 1, wherein the microprocessor provides a random offset to the VCA current.

6. The apparatus of claim 2, further comprising a striking implement retainer secured to the rotatable shaft.

7. A method of robotic drumming, comprising:
applying a drive signal to a voice coil actuator (VCA) that includes a shaft;
with a linear-to-rotary motion convertor coupled to the shaft of the voice coil actuator and a rotatable shaft coupled to the linear-to-rotary motion convertor so as to rotate in response to a linear motion of the shaft of the VCA, converting a linear motion of a shaft of the VCA to a rotary motion;
with a rotary encoder coupled to the linear-to-rotary motion convertor, indicating a rotation produced by the linear-to-rotary motion convertor;
coupling a drumstick to a striking implement retainer secured to the rotatable shaft so as to be rotated in response to the rotary motion, wherein the drumstick is rotated so as to strike a surface corresponding to a drum head, wherein the drive signal is associated with a series of contacts with the drum head surface, and is based on drumstick displacement stored in a tangible computer readable medium;
detecting contact of the striking implement with the drum head, and in response, reducing the drive signal, wherein the drive signal applied to the VCA is an EMF and the contact with the drum head is detected based on detection of a back EMF produced in response to the EMF applied to the VCA;
contacting the drum head at a plurality of locations in response to the EMF applied to the VCA;
detecting at least one back EMFs associated with the plurality of locations; and
based on detection of the at least one back EMF, determining a surface shape of at least a portion of the drum head.

8. The method of claim 7, wherein the drive signal is associated with a series of contacts with the drum head surface, and is based on drumstick displacement stored in a tangible computer readable medium.

9. The method of claim 8, wherein the series of contacts includes average values and deviations for one or more of drumstick tip speed, drumstick displacement above the drum head, and drumstick movement initiation time.

10. The method of claim 7, wherein the EMF is applied to the VCA as a pulse width modulated (PWM) EMF, and further comprising adjusting at least one of a pulse width, a pulse amplitude, or a duty cycle of the PWM EMF in response to detection of contact with the drum head.

11. The method of claim 7, wherein the surface shape includes at least one of a surface extent and a surface tilt.

12. The method of claim 7, further comprising adjusting a timing of the EMF applied to the VCA.

13. The method of claim 7, further comprising setting the drumstick to strike the surface based on an acceleration associated with the VCA.

\* \* \* \* \*